CONTACTLESS POTENTIOMETER USING ROTATABLE SLITTED CYLINDER
Original Filed April 21, 1966
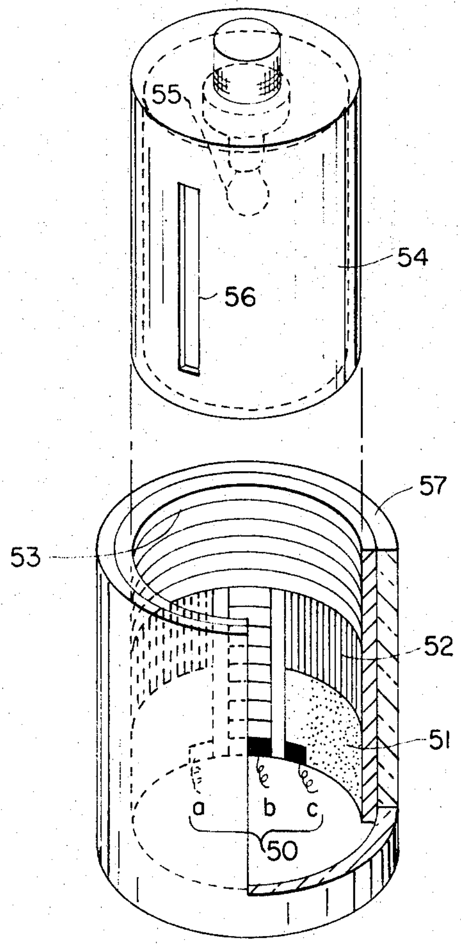
INVENTOR
RHODES R. CHAMBERLIN
BY Louis A. Kline
John J. Callahan
HIS ATTORNEYS United States Patent Office 3,539,816

Patented Nov. 10, 1970

3,539,816

CONTACTLESS POTENTIOMETER USING ROTATABLE SLITTED CYLINDER

Rhodes R. Chamberlin, Dayton, Ohio, assignor to The National Cash Register Company, Dayton, Ohio, a corporation of Maryland Original application Apr. 21, 1966, Ser. No. 544,193, now Patent No. 3,449,705, dated June 10, 1969. Divided and this application Aug. 20, 1968, Ser. No. 812,479

Int. Cl. H01l 15/06

U.S. Cl. 250—211 1 Claim

ABSTRACT OF THE DISCLOSURE

The present invention relates to an improved contactless potentiometer. A photoresistive assembly, comprising a flexible photoconductive film between a flexible low-resistance film and a flexible high-resistance film upon a flexible anodized aluminum foil, is used in the contactless potentiometer. The photoresistive assembly allows for easier contactless potentiometer fabrication.

This is a division of application Ser. No. 544,193, filed Apr. 21, 1966 now Pat. No. 3,449,705.

This invention relates to a photosensitive semiconductor device comprising thin flexible aluminum foil and, more particularly, has reference to a photosensitive device such as a contactless potentiometer wherein a thin, flexible, anodized aluminum foil forms the support or substrate for the photosensitive element of the device.

Commercially-available photoconductive devices are basically simple structures which comprise, generally, a highly insulating and inert base or substrate, a photosensitive semiconductor layer or deposit overlaying the substrate, a thin electrode configuration in ohmic contact with the said semiconductor layer, and a package for protection and ease of application. In such prior-art devices, the substrate is generally of glass, quartz, ceramics, and similar heat-resistant materials. The device package or container may be made of different protective materials; however, the package is generally metal or plastic. The common photoconductor package consists of a metallic can with transparent window, such as the TO–5 can. Various plastics are also useful for packaging photoconductors as well as many other types of photosensitive and semiconductive devices.

Photovoltaic devices, in general, are slightly more complex than simple photoconductor cells and comprise, as a minimum, a heat-resistant substrate, a semiconductor junction, at least two electrodes, one of which is transparent, and, usually, a package suited to the intended applications.

In the above-mentioned and related prior-art photosensitive devices, thin semiconducting layers and, in some applications, thin electroconductive layers are applied, singly or as multiple layers, as required, by one or more of several well-known prior-art methods. Conventional methods of applying photosensitive films and/or layers, as by evaporation, chemical deposition, sintering, and vapor reaction, are suitable for certain applications; however, each of these methods is known to suffer from many disadvantages. The principal disadvantages associated with such conventional methods are set forth in U.S. Letters Patent No. 3,148,084, which issued on Sept. 8, 1964, on the application of James E. Hill and Rhodes R. Chamberlin, and the disclosure of which is incorporated herein by reference. It should be understood that, despite the disadvantages inherent in the above-mentioned methods, for some applications acceptable photosensitive devices may be fabricated therewith; however, for reasons which will be apparent below, the spray process for making thin photosensitive films disclosed in the said U.S. Pat. No. 3,148,084, is greatly preferred.

Of the many advantages associated with the Hill and Chamberlin spray process, among the most important from a practical and manufacturing standpoint are (1) it renders unnecessary the expensive, delicate, difficult-to-control, and sometimes cumbersome equipment of prior-art methods—typically, high-vacuum equipment; (2) it provides a method well adapted for continuous manufacturing techniques; (3) it provides the most efficient and simple method of controlling the film composition, the impurity concentration, and the making of multi-element and/or multi-film combinations; and (4) it provides large photosensitive areas with film uniformity comparable to small photosensitive areas. The above-mentioned features of the Hill and Chamberlin spray process are emphasized herein, not only because that process is far superior to conventional processes for most applications and at least in its relation to the invention, but also because the advantages inherent in the process and in the use of anodized aluminum foil complement each other to a high degree when the process and the foil are used together. For example, anodized aluminum foil may be obtained, in various widths, as a continuous strip in roll form, in which form it is well suited for use in a continuous system for manufacturing many types of photoconductive as well as photovoltaic and the like films and articles. In this regard, it can be seen that the anodized foil in roll form and the Hill and Chamberlin spray process are both highly suited for use in a continuous production system, and, thus, one complements the other.

Among the many other features and advantages which inhere in the use of anodized aluminum foil, per se, the following are specifically pointed out.

(1) Since the foil is flexible and since, in both the batch and continuous manufacturing method, the foil is accordingly held down by vacuum at an even pressure over the heated platen, its use provides for great improvement in uniformity of substrate temperature during spraying. The extreme important of this feature will be readily appreciated by those skilled in the art. Except with the very small substrates, it is difficult, if not impossible, to obtain uniform surface temperatures with prior-art rigid glass and ceramic substrates. It is known that such lack of temperature uniformity leads to deficiencies in the deposited film. The common deficiencies may become apparent as areas having different degrees of crystallinity, or in some instances the crystal morphology is such, in localized areas, as to render those areas useless for photosensing. Without attempting a theoretical explanation, it has been found that greater uniformity is more readily obtained with the anodized foil of the present invention than with the rigid glass and ceramic substrates of the prior art, and the use thereof obviates such prior-art disadvantages. Generally, such improved uniformity is manifested as improvements in electrical, physical, and optical characteristics of the photosensitive devices in question.

Accordingly, it will be recognized that the fabrication of large-area photosensitive films and devices having uniform characteristics is facilitated by utilizing the novel features of the present inventon.

(2) The relatvely low cost of anodized aluminum foil per unit area versus the cost of conventional ceramic allows for commercial development and sale of large-area photosensitive film, matrices, and devices. Heretofore, the cost of large-area substrates has been prohibitive and thus effectively discouraged development therein. Especially significant in this area is the fact that the cost of large-area ceramic substrates increases exponentially as the area increases, whereas the foil cost increases only linearly with increase in area.

(3) Compared to devices having conventional substrates, those of the present invention comprising anodized aluminum foil have greatly improved heat-transfer characteristics. Accordingly, when connected with a suitable heat sink, devices of the present invention are effective for operation at power levels far exceeding those attainable with prior-art devices.

(4) The aluminum foil and devices made therewith are very flexible, the characteristic suggesting many novel applications; for example, a foil-based photocell may be wrapped or folded around a light source to more efficiently sense radiated light. Thus, foil-based photo elements make it possible to compact many elements into a small photo module package. Additionally, the flexible character of the foil allows the use of continuous manufacturing techniques for the fabrication thereof.

(5) In the many applications where weight and/or size are critical, foil-based devices are clearly of great advantage. It has been found that solar or photovoltaic cells comprising anodized aluminum foil, according to the instant invention, provide a substantial increase in power-to-weight ratio when compared with prior-art cells of comparable area. Specifically, the power-to-weight ratio of the solar or photovoltaic cells of the invention is at least double that of prior-art cells of the same size. The great saving in weight is due primarily to the difference in foil weight. That is, a typical non-aluminum base foil consists of 1-mil-thick phosphor-bronze foil with thin layers of CdS and $Cu_xS_y$ thereon. A three-inch by three-inch foil of this composition weighs about 1.6 grams; however, the same size aluminum foil weighs only about 0.58 gram.

(6) Photosensitive layers, as small individual cells or as a complex matrix, may be formed in any desired configuration and cut or punched out of the foil directly, as in a continuous manufacturing system. The apparent ease with which anodized aluminum foil structures may be formed is, among others, an important characteristic rendering such material so well suited for use in an automated continuous belt or line process. The foil characteristics are such as to allow for production of photosensitive devices on a continuous basis. In carrying out a manufacture of this type, consecutive stations, such as thin-film spraying, heat-treating, electroding, punching out, etc., are arranged along the foil, which is moved at a carefully programmed rate.

(7) Foil-based photosensitive devices may be packaged, encapsulated, or laminated in any manner and with material known in the art. Additionally, however, a unique polymeric package is possible with devices which comprises an anodized aluminum substrate. Inasmuch as the aluminum foil is impervious to moisture, it is possible to seal a photo-element on a foil base by heat-bonding a plastic film to the upper, or light-sensitive, surface of the foil.

In some applications, particularly in relation to photoconductive and photovoltaic devices, use of flexible aluminum foil provides substantial reduction in manufacturing time. Its use in photovoltaic cells, for example, eliminates at least two electroplating steps, such being usually required in making an alloy interface on a phosphor-bronze foil. Furthermore, the economy provided by eliminating the two electroplating steps is reinforced by the substitution of sprayed layers or films, in accordance with the Hill and Chamberlin United States patent, for all active and necessary elements of the cells.

Accordingly, it is the principal object of the present invention to provide novel photosensitive devices which comprise, as substrate, a flexible anodized aluminum foil and, as a photosensitive element, at least one semiconductive thin film adherently combined therewith.

Another object of the invention is the provision of a fast, efficient, and economical method for manufacturing high-quality photosensitive devices, wherein a continuous length of anodized aluminum foil is controllably fed through processing stations on a continuous basis, resulting in finished and packaged devices at a selected terminal station of the continuous processing line.

Yet another object of the invention is the provision of a photoconductive device comprising anodized aluminum foil as a substrate effective in high power level operation. Devices of the invention have superior heat-transfer characteristics, and, when used with a heat sink, they at least double the power-to-area ratio which is common with conventional glass or ceramic devices.

Still another object of the invention is to provide a photosensitive film comprising anodized aluminum foil wherein the film has superior physical as well as electrical uniformity.

A further object of the invention is the provision of large-area photosensitive devices comprising a thin photosensitive layer deposited on anodized aluminum foil.

Another object of the invention is to provide a photosensitive device comprising a photosensitive layer disposed on anodized aluminum foil wherein the combination is wrapped or otherwise bent into a regular or irregular shape, so as to expose selected areas to light or to facilitate the fabrication of devices having irregular or complex contours.

Yet another object is to provide a complex photosensitive array or matrix disposed on flexible anodized aluminum foil, which, because of inherent advantages realized by use of foil, permits the economical manufacture of such complex structures.

Still another object of the invention is to provide a photosensitive device comprising a plurality of thin films on a substrate of anodized aluminum foil wherein the said thin films are deposited on said foil by a spray process and where at least one of said films is photosensitive.

The novel features of the invention, together with further objects and advantages thereof, will be more clearly understood from the following descriptions, considered in connection with the accompanying drawings, in which several embodiments of the invention are illustrated.

FIG. 1 is an expanded view of a potentiometric device comprising a folded aluminum foil in accordance with the invention.

In the figure, a device having an outer body assembly 57 and an inner body assembly 54 is shown with the latter in a position removed from its normal operative position within the outer body assembly 57. The inner body assembly 54 acts as a light shield and comprises a cylindrical opaque body with means provided therein, such as the light means 55, for illuminating the light slit 56. In accordance with the invention, the outer body assembly 57 is provided with a photoresistive assembly, contiguous with the inside surface of said body 57, which comprises thin conductive areas 51, 52, and 53. In accordance with the invention, the conductive areas 51, 52, and 53 are advantageously disposed, typically in the shape shown in the figure, on a strip of flexible anodized aluminum foil, which, as depicted, is then folded to fit tightly inside the outer body assembly 57. The photoresistive assembly comprising the areas 51, 52, and 53 is so positioned that light transmitted by the light slit 56 impinges on the photoresponsive area 52. In a representative voltage divider or contactless potentiometer of the type shown in the figure, the sheet resistances of the said areas are different in magnitude. The area 53 is a predominantly conductive area having a terminus for electrical contact shown as lead *b* of contact points 50. The conductive area 53 may, for example, consist of indium, which may be applied by evaporation of the metal, or by dipping an area of aluminum foil in molten indium, etc. Indium conductive areas of the type described have low resistance; for example, approximately .01 ohm per square. In contrast to the low-resistance area 53, the area 51 is a relatively high-resistance film disposed along one edge of an anodized aluminum foil, as shown. Leads *a* and *c* are connected one to each extremity of the resistive area 51. The area 51 may typically consist of a dried strip of resistive paint or silk-screened cermet metal composition and the like, the materials and the techniques being conventional. Representative resistances of the area 51 film may be, for example, 1,000 ohms to 1 megohm.

The semiconductive area 52 is in contact with both the conductive area 53 and the resistive area 51. In this position, the area 52 serves as the means for carrying current between the areas 53 and 51. When the inner assembly 54 rotated on its vertical axis, the light slit 56 is moved 360 degrees, if desired, and thus moves from one extremity of the resistive path 51 to the other. In effect, movement of the light slit 56, as described, provides a conducting path in the semiconductor area 52, which may be adjusted from one end to the other of the primarily resistive strip 51. Not shown in the figure are means for turning the inner body assembly 54, electrical measuring means, and the like, which may be provided in conventional or suitable form.

Of particular significance to the present embodiment of the figure is the use of thin flexible anodized aluminum foil as substrate for a photoconductive film which may be bent into a desirable shape, with great utility and with no difficulty whatsoever.

The photoconductive area 52 may be prepared by conventional procedures with known light-sensitive materials such as CdS, ZnS, CdSe, etc. However, in view of the foregoing, it will be understood that spray-deposited CdS, CdSe, etc., films, with or without post-heat-treatment in this particular application, as referred to in U.S. Pat. No. 3,148,084, are the preferred photoconductive materials of the area 52.

What is claimed is:

1. A contactless potentiometer comprising a first inner body and a second outer body, said inner body rotatably mounted inside the said outer body, said first inner body comprising an opaque cylindrical structure having a narrow light slit along the vertical axis of the said inner body, means for rotating the said inner body, and light means supported within the said inner body, said second outer body comprising an opaque cylindrical structure having in contact with the inside surface of said outer body a photoresistive assembly, said photoresistive assembly comprising a strip of thin flexible anodized aluminum foil having one surface in contact with the inside surface of said second outer body, and its other surface supporting a photoconductive film, a low-resistance film, and a relatively high-resistance film, all of the said films being disposed in contiguous parallel relation along the inside circumference of the aluminum foil, with the photoconductive film being positioned between said low- and said high-resistance films, and electrode means attached to each of said low- and high-resistance films.

References Cited

UNITED STATES PATENTS

| | | | |
|---|---|---|---|
| 1,514,123 | 11/1924 | Bacevicz | 250—211 X |
| 2,105,303 | 1/1938 | Van Geel | 250—211 X |
| 3,188,476 | 6/1965 | Karmiggelt et al. | 250—211 |
| 3,194,967 | 7/1965 | Mash | 250—211 |
| 3,258,601 | 6/1966 | Suleski | 250—211 |
| 3,315,111 | 4/1967 | Jaffe et al. | 313—108 |

WALTER STOLWEIN, Primary Examiner

U.S. Cl. X.R.

250—239